United States Patent
Lee

(10) Patent No.: US 12,512,400 B2
(45) Date of Patent: Dec. 30, 2025

(54) SEMICONDUCTOR PACKAGES

(71) Applicant: Samsung Electronics Co., Ltd., Suwon-si (KR)

(72) Inventor: Eunsu Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 371 days.

(21) Appl. No.: 18/340,193

(22) Filed: Jun. 23, 2023

(65) Prior Publication Data

US 2024/0136272 A1  Apr. 25, 2024
US 2024/0234286 A9  Jul. 11, 2024

(30) Foreign Application Priority Data

Oct. 24, 2022  (KR) .................. 10-2022-0137582

(51) Int. Cl.
*H01L 23/52* (2006.01)
*H01L 21/48* (2006.01)
(Continued)

(52) U.S. Cl.
CPC ...... *H01L 23/49838* (2013.01); *H01L 21/486* (2013.01); *H01L 23/49816* (2013.01); *H01L 23/49833* (2013.01); *H01L 25/105* (2013.01); *H10B 80/00* (2023.02); *H01L 24/16* (2013.01); *H01L 2225/1023* (2013.01);
(Continued)

(58) Field of Classification Search
CPC ............. H01L 23/49838; H01L 21/486; H01L 23/49816; H01L 23/49833; H01L 25/105; H01L 24/16; H01L 24/32; H01L 24/73; H01L 2224/16227; H01L 2224/16238; H01L 2224/32225; H01L 2224/73204; H01L 2225/1023; H01L 2225/1041;
(Continued)

(56) References Cited

U.S. PATENT DOCUMENTS 7,084,500 B2  8/2006  Swanson et al.
9,237,659 B2  1/2016  Hossain et al.
(Continued)

FOREIGN PATENT DOCUMENTS

KR  20170010708 A  2/2017
KR  102150260 B1  9/2020
KR  102345061 B1  12/2021

*Primary Examiner* — Theresa T Doan
(74) *Attorney, Agent, or Firm* — Wolf, Greenfield & Sacks, P.C.

(57) ABSTRACT

A semiconductor package including: a front redistribution structure including an insulating layer defining an upper surface, a lower surface opposing the upper surface, and a side surface, front redistribution layers including a first redistribution layer on a first level adjacent to the lower surface and second redistribution layers on a second level higher than the first level relative to the lower surface, the second redistribution layers having an inner redistribution layer and an outer redistribution layer, a recess exposing at least a portion of the outer redistribution layer, and a dam on at least one side of the recess; connection bumps including a first bump electrically connected to the first redistribution layer and a second bump electrically connected to the outer redistribution layer within the recess; and an underfill that extends along a side surface of the second bump and a side surface of the dam within the recess.

20 Claims, 12 Drawing Sheets

(51) Int. Cl.
  *H01L 23/48*     (2006.01)
  *H01L 23/498*    (2006.01)
  *H01L 25/10*     (2006.01)
  *H10B 80/00*     (2023.01)
  *H01L 23/00*     (2006.01)

(52) U.S. Cl.
  CPC ............. *H01L 2225/1041* (2013.01); *H01L 2225/1058* (2013.01); *H01L 2924/1431* (2013.01); *H01L 2924/1434* (2013.01)

(58) Field of Classification Search
  CPC ..... H01L 2225/1058; H01L 2924/1431; H01L 2924/1434; H10B 80/00
  USPC ........................................................ 257/737
  See application file for complete search history.

(56) References Cited

U.S. PATENT DOCUMENTS

| | | |
|---|---|---|
| 9,520,372 B1 | 12/2016 | Jeng et al. |
| 10,074,625 B2 | 9/2018 | Velez et al. |
| 10,410,855 B2 | 9/2019 | Nishikawa et al. |
| 11,289,412 B2 * | 3/2022 | Williamson ........ H01L 21/4857 |
| 11,328,970 B2 | 5/2022 | Park et al. |
| 11,528,809 B2 * | 12/2022 | Hossain ............ H01L 23/49816 |

* cited by examiner

SEMICONDUCTOR PACKAGES

CROSS-REFERENCE TO RELATED APPLICATION

This application claims the priority and benefit of Korean Patent Application No. 10-2022-0137582, filed on Oct. 24, 2022, with the Korean Intellectual Property Office, the inventive concept of which is incorporated herein by reference.

BACKGROUND

1. Field

The present inventive concept relates to semiconductor packages.

2. Description of Related Art

When a semiconductor package is mounted on a main board of an electronic device, a crack may occur in a connection terminal (e.g., a solder ball) connecting the package and the main board due to a difference in a coefficients of thermal expansion (CTE) of a semiconductor chip and the main board.

SUMMARY

Aspects of the present inventive concept provide semiconductor packages having improved reliability.

According to aspects of the present inventive concept, provided is a semiconductor package, the semiconductor package including: a front redistribution structure that has an upper surface, a lower surface opposing the upper surface, and a side surface, the front redistribution structure including: an insulating layer that defines the upper surface, the lower surface, and the side surface; front redistribution layers that include a first redistribution layer on a first level adjacent to the lower surface and second redistribution layers on a second level higher than the first level relative to the lower surface, the second redistribution layers having an inner redistribution layer and an outer redistribution layer between the inner redistribution layer and the side surface; a recess that extends into the insulating layer from the lower surface to expose at least a portion of the outer redistribution layer; and a dam on at least one side of the recess; a semiconductor chip on the upper surface of the front redistribution structure and including a connection pad electrically connected to the front redistribution layers; an encapsulant that seals at least a portion of the semiconductor chip on the upper surface of the front redistribution structure; a back redistribution structure on the encapsulant and including back redistribution layers; a through-via that extends in the encapsulant and electrically connects the front redistribution layers to the back redistribution layers; connection bumps on the lower surface of the front redistribution structure and including a first bump electrically connected to the first redistribution layer and a second bump electrically connected to the outer redistribution layer within the recess; and an underfill that extends along a side surface of the second bump and a side surface of the dam within the recess.

According to aspects of the present inventive concept, provided is a semiconductor package, the semiconductor package including: a semiconductor chip; a front redistribution structure having an upper surface that the semiconductor chip is on and a lower surface that includes an inner region overlapping the semiconductor chip in a direction perpendicular to the lower surface and an outer region that at least partially surrounds the inner region, the front redistribution structure including: an insulating layer that defines the upper surface and the lower surface; first redistribution layers adjacent to the lower surface; second redistribution layers more adjacent to the upper surface than the first redistribution layers; a recess that extends along the outer region and exposes at least a portion of one or more of the second redistribution layers; and an inner dam on a first side of the recess adjacent to the inner region; first bumps in the inner region and electrically connected to the first redistribution layers; second bumps in the outer region and electrically connected to the at least a portion of the one or more of the second redistribution layers; and an underfill that at least partially surrounds the second bumps within the recess.

According to aspects of the present inventive concept, provided is a semiconductor package, the semiconductor package including: a front redistribution structure that has an upper surface and a lower surface opposing each other, the front redistribution structure including: first redistribution layers adjacent to the lower surface; second redistribution layers more adjacent to the upper surface than the first redistribution layers; an inner insulating layer that at least partially surrounds the first redistribution layers and the second redistribution layers; an outer insulating layer defining the lower surface below the inner insulating layers and having openings that expose at least a portion of one or more of the first redistribution layers; a recess exposing at least a portion of one or more of the second redistribution layers and extending in the outer insulating layer and the inner insulating layer; and a dam on at least one side of the recess; a semiconductor chip on the upper surface of the front redistribution structure; first bumps in the openings of the outer insulating layer and electrically connected to the at least a portion of the one or more of the first redistribution layers; second bumps in the recess and electrically connected to the at least a portion of the one or more of the second redistribution layers; and an derail that at least partially surrounds the second bumps within the recess.

BRIEF DESCRIPTION OF THE DRAWINGS

The above and other aspects, features, and advantages of the present inventive concept will be more clearly understood from the following detailed description taken in conjunction with the accompanying drawings, in which:

FIGS. 8A to 8K are cross-sectional views illustrating a manufacturing process of the semiconductor package of FIG. 1A according a process sequence.

DETAILED DESCRIPTION

Hereinafter, example embodiments of the present inventive concept will be described with reference to the accompanying drawings as follows.

Figure 1A:
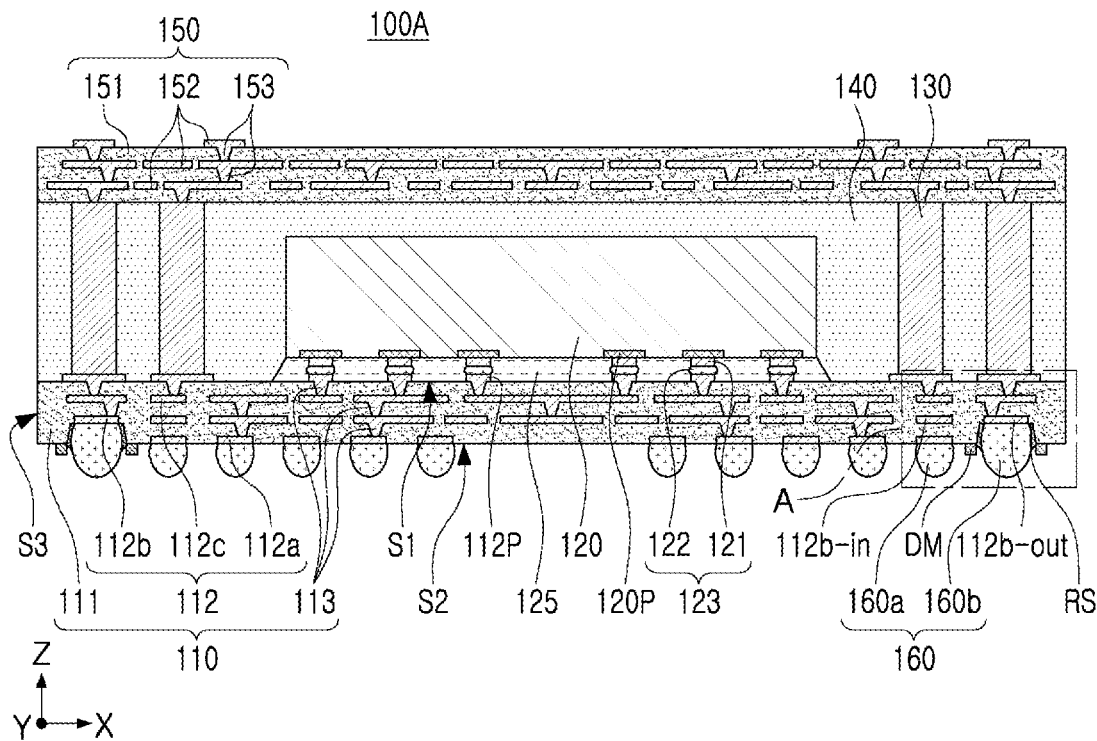
FIG. 1A is a cross-sectional view of a semiconductor package according to example embodiments of the present inventive concept.
Figure 1B:
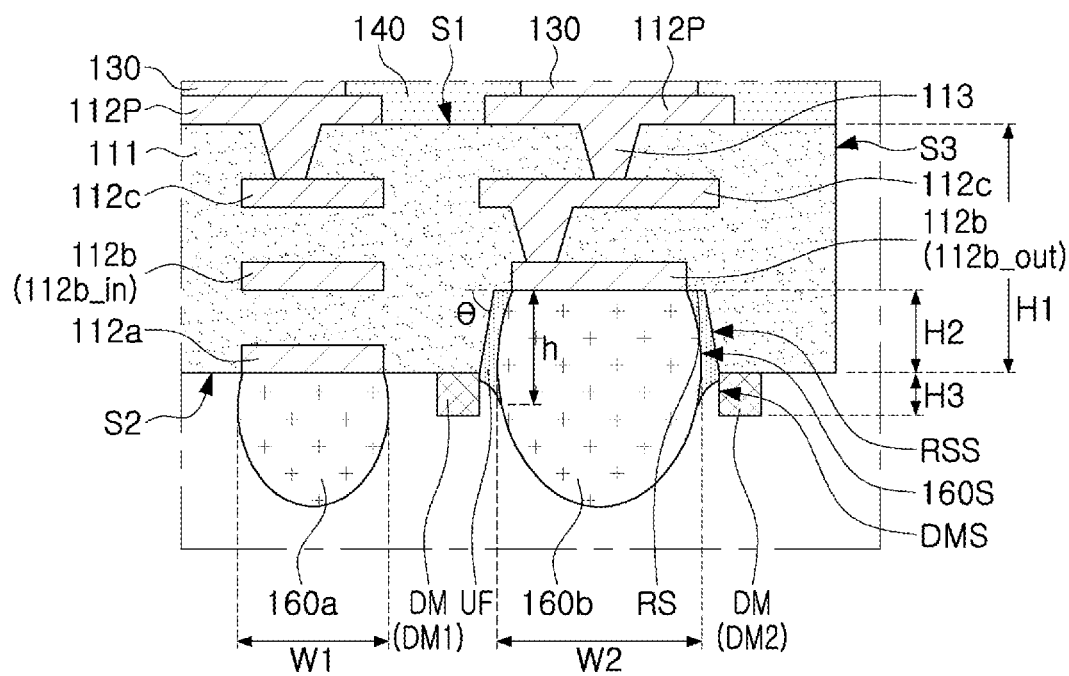
FIG. 1B is a partially enlarged view illustrating the region 'A' of FIG. 1A
Figure 1C:
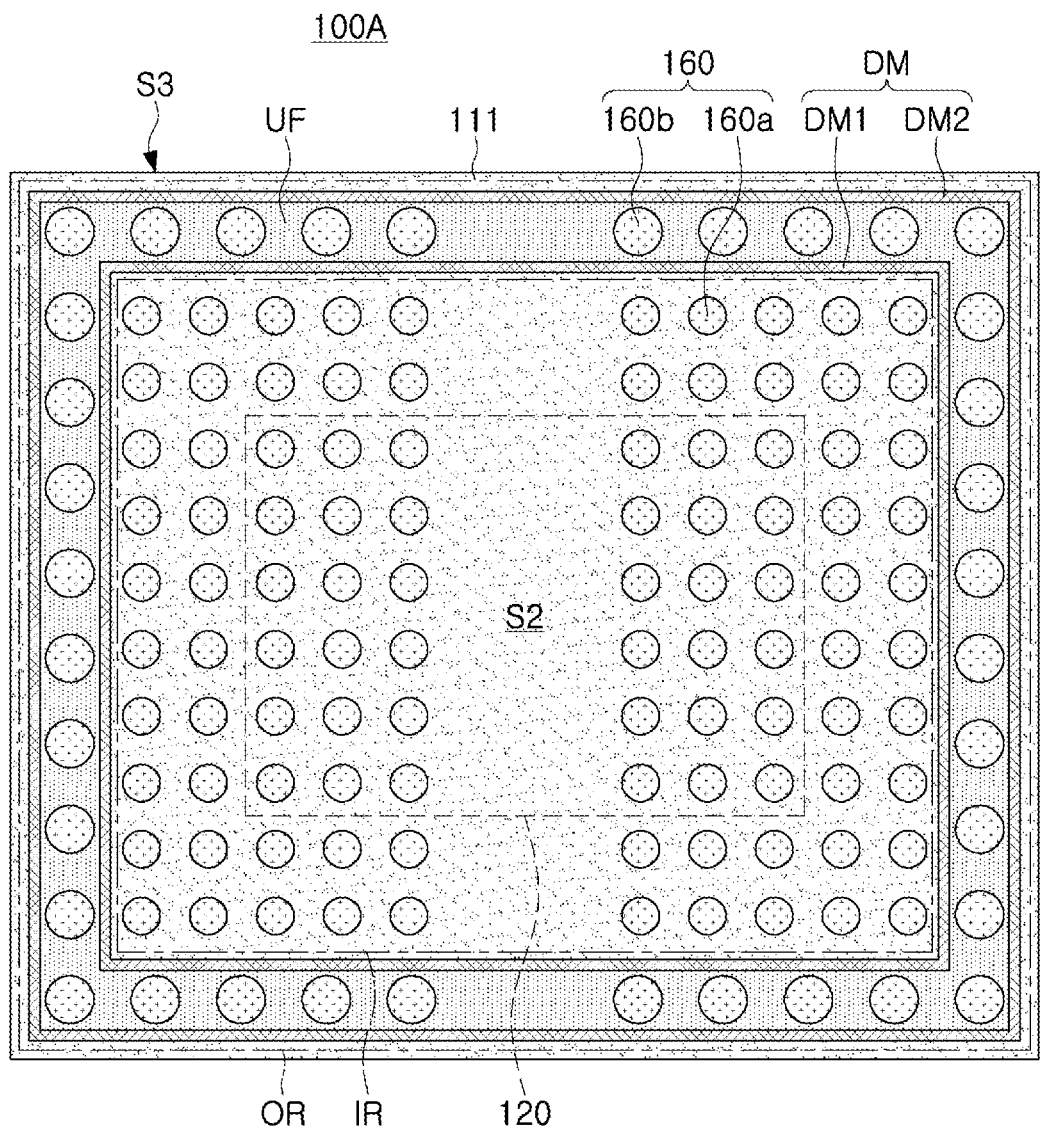
FIG. 1C is a bottom view illustrating a lower surface of the semiconductor package of FIG. 1A.

FIG. 1A is a cross-sectional view of a semiconductor package 100A according to example embodiments of the present inventive concept, FIG. 1B is a partially enlarged view illustrating the region 'A' of FIG. 1A, and FIG. 1C is a bottom view illustrating a lower surface of the semiconductor package 100A of FIG. 1A.

Figure 2A:
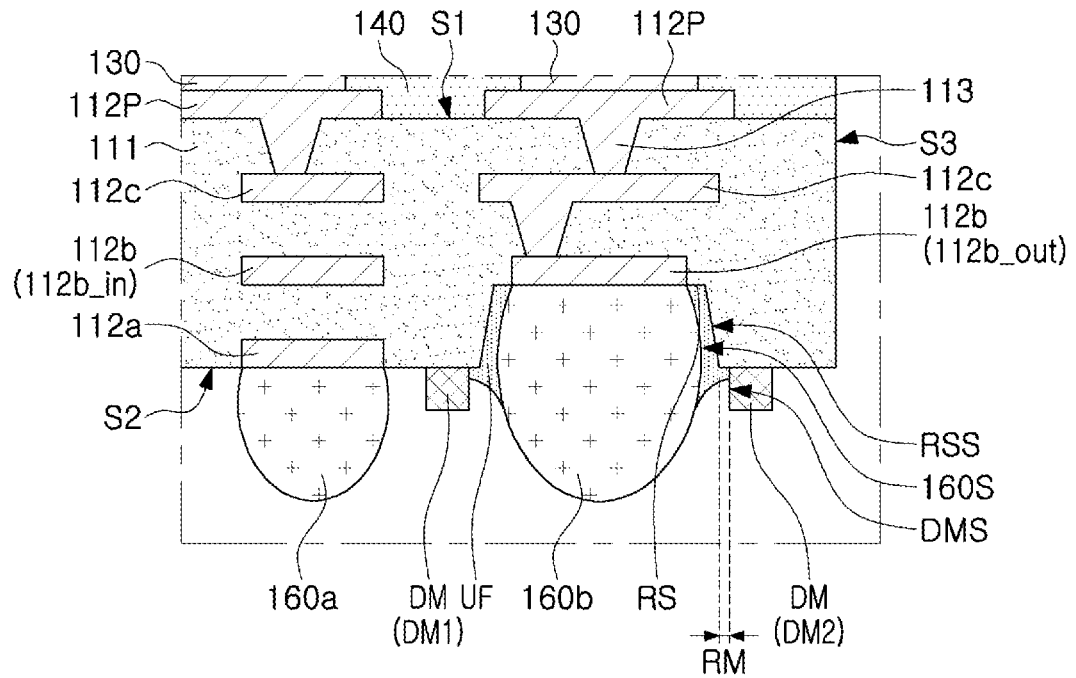
FIGS. 2A and 2B are partially enlarged views illustrating exemplary modifications of some components, respectively.
Figure 2B:
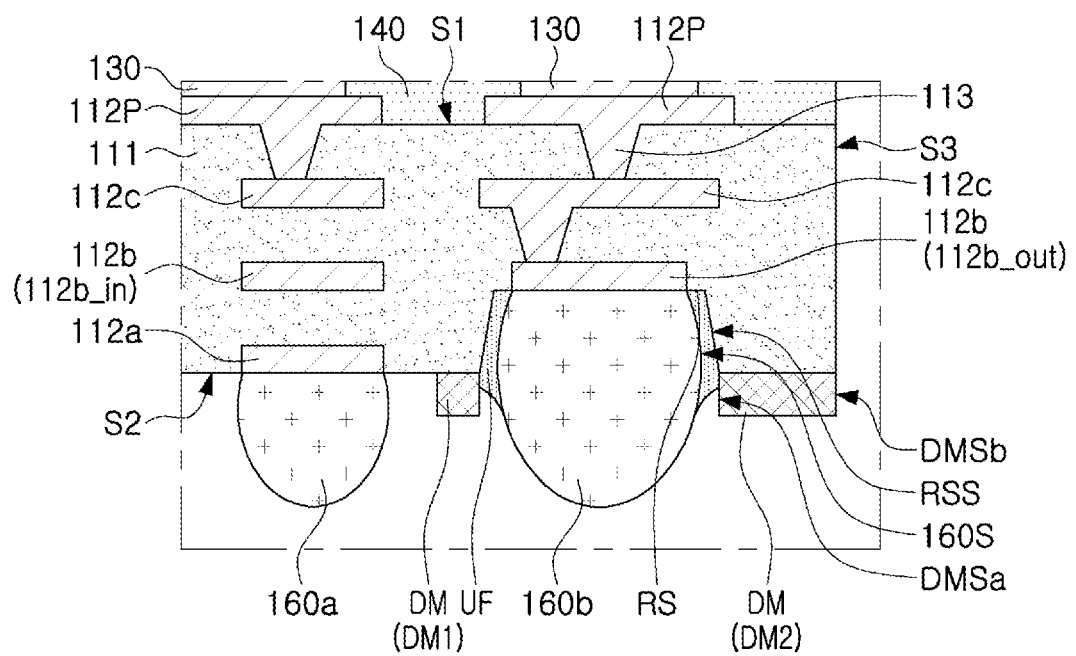

FIGS. 2A and 2B are partially enlarged views illustrating an exemplary modification of a dam DM, respectively.

Referring to FIGS. 1A to 1C, a semiconductor package 100A according to example embodiments may include a front redistribution structure 110, a semiconductor chip 120, first bumps 160a, second bumps 160b, and an underfill (UF). In addition, the semiconductor package 100A may further include a through-via 130, an encapsulant 140, and a back redistribution structure 150.

In the present inventive concept, by introducing a recess RS accommodating a large-size bump (hereinafter, referred to as a second bump 160b) and an underfill UF supporting and fixing the second bump 160b in the recess RS on a lower surface S2 of the front redistribution structure 110, cracks may be prevented and reliability may be improved. In addition, by forming a dam DM around the recess RS, overflow of the underfill UF and contamination of the surrounding bumps (hereinafter, referred to as first bumps 160a) may be prevented, and a contact area between the underfill UF and the second bump 160b may be increased. For example, when a semiconductor package is mounted on a main board of an electronic device, stress may be concentrated on bumps in a partial region, for example, an outer region of the package, due to warpage occurring in the package and the board, respectively. In the semiconductor package 100A according to example embodiments, cracks may be prevented and board level reliability (BLR) may be improved by applying the second bump 160b and the underfill UF to a region on which stress is concentrated. Hereinafter, each component of the semiconductor package 100A will be described in detail.

The front redistribution structure 110 is a support substrate on which the semiconductor chip 120 is mounted, and may have an upper surface S1 and a lower surface S2, opposing each other, and a side surface S3 between the upper surface S1 and the lower surface S2, and may include an insulating layer 111, front redistribution layers 112, a front redistribution via 113, a recess RS, and a dam DM.

The insulating layer 111 may define an upper surface S1, a lower surface S2, and a side surface S3 of the front redistribution structure 110. The insulating layer 111 may be formed to surround at least a portion of the front redistribution layers 112. The insulating layer 111 may include a plurality of layers stacked in a vertical direction (Z-axis direction). Depending on the process, the boundary between the plurality of layers may be unclear. The insulating layer 111 may include an insulating resin. The insulating resin may include a thermosetting resin such as an epoxy resin, a thermoplastic resin such as polyimide, or a resin impregnated with an inorganic filler in these resins, for example, prepreg, ABF (Ajinomoto Build-up Film), FR-4, BT, or the like. For example, the insulating layer 111 may include a photosensitive resin such as photoimageable dielectric (PID).

The front redistribution layers 112 may include a plurality of redistribution layers 112a, 112b, and 112c disposed on different levels. For example, the front redistribution layers 112 may include first redistribution layers 112a, second redistribution layers 112b, and third redistribution layers 112c, disposed in the insulating layer 111. Here, the first redistribution layers 112a may be disposed on a first level, adjacent to the lower surface S1 of the front redistribution structure 110, the second redistribution layers 112b may be disposed on a second level, higher than the first level, and the third redistribution layers 112c may be disposed on a third level, higher than the second level. The second bumps 160b according to example embodiments of the present inventive concept may be connected to the redistribution layers 112b and 112c of the second or third level through the recess RS. For example, the second bumps 160b may be connected to the second redistribution layers 112b, more adjacent to the upper surface S1 of the front redistribution structure 110 than the first redistribution layer 112a.

In example embodiments, the second bumps 160b may be disposed on an edge of the package on which stress is concentrated. The second bumps 160b may be connected to at least a portion of second redistribution layers disposed on an edge of the front redistribution structure 110 among the second redistribution layers 112b (hereinafter, referred to as outer redistribution layers 112b_out). For example, the second redistribution layers 112b may include an inner redistribution layer 112b_in disposed in a central portion of the front redistribution structure 110, and an outer redistribution layer 112b_out disposed between the inner redistribution layer 112b_in and the side surface S3 of the front redistribution structure 110. The outer redistribution layer 112b_out may be electrically connected to the through-via 130 through the front redistribution vias 113 and the third redistribution layer 112c, but example embodiments thereof are not limited thereto. Depending on the example embodiments, the outer redistribution layer 112b_out may be electrically insulated from the through-via 130. Depending on the example embodiments, the front redistribution layers 112 may further include a pad portion 112P disposed on the upper surface S1 of the front redistribution structure 110. The pad portion 112P may be connected to the semiconductor chip 120 or the through via 130. A barrier layer (not shown) may be disposed above the pad portion 112P. The barrier layer may include a material resistant to oxidation, for example, nickel (Ni), gold (Au), or an alloy thereof.

The front redistribution layers 112 may include, for example, copper (Cu), aluminum (Al), silver (Ag), tin (Sn), gold (Au), nickel (Ni), lead (Pb), titanium (Ti), or a metal material including an alloy thereof. The front redistribution layers 112 may perform various functions according to design. For example, the front redistribution layers 112 may include a ground (GND) pattern, a power (PWR) pattern, and a signal (S) pattern. Here, the signal (S) pattern may provide a transmission path for various signals, e.g., a data signal, or the like, excluding the ground (GND) pattern and the power (PWR) pattern.

The front redistribution via 113 may be electrically connected to the front redistribution layers 112 by penetrating or extending through a portion of the insulating layer 111. For example, front redistribution vias 113 may interconnect front redistribution layers 112 of different levels. The front redistribution vias 113 may include a signal via, a ground via, and a power via. The front redistribution via 113 may include, for example, copper (Cu), aluminum (Al), silver (Ag), tin (Sn), gold (Au), nickel (Ni), lead (Pb), titanium (Ti), or an alloy thereof. The front redistribution via 113 may be a filled via in which a metal material is filled in a via hole or a conformal via in which a metal material extends along an inner wall of the via hole.

The recess RS may provide an accommodating space for the second bumps 160b on the lower surface S2 of the front redistribution structure 110, and may extend into the insulating layer 111 to expose at least a portion of the outer redistribution layers 112b_out.

The recess RS may have a depth H2 in a range of about 10% to about 25% of the thickness H1 from the upper surface S1 to the lower surface S2 of the front redistribution structure 110, but example embodiments thereof are not limited thereto. A depth H2 of the recess RS may be determined in consideration of the height H3 of the second bumps 160b and the dam DM. For example, the recess RS may be formed to a depth H2 at which the second bumps 160b are sufficiently exposed downwardly of the dam DM. A side surface RSS of the recess RS may have an inclination angle θ with respect to a bottom of the recess RS. As used herein, the bottom of the recess RS may refer to the portion of the recess RS that is the greatest distance from the lower surface S2 of the front redistribution structure 110, in a direction perpendicular to the lower surface S2 of the front redistribution structure 110 (e.g., Z direction). For example, the bottom of the recess RS may be a portion of the recess RS adjacent to the outer redistribution layer 112b_out. The inclination angle θ of the side surface RSS of the recess RS may be about 80 degrees or more, for example, in a range of about 80 degrees to about 90 degrees, but example embodiments thereof are not limited thereto.

As illustrated in FIG. 1C, the recess RS may continuously extend on the lower surface S2 of the front redistribution structure 110, but example embodiments thereof are not limited thereto. Depending on the example embodiments, the recess RS may be provided as a plurality of recesses corresponding to the plurality of second bumps 160b.

The dam DM may be disposed on at least one side of the recess RS. For example, the dam DM may include an inner dam DM1 disposed between the second bumps 160b and the first bumps 160b, and an outer dam DM2 disposed between the second bumps 160b and the side surface S3 of the front redistribution structure 110. Depending on the example embodiments, the dam DM may include only the inner dam DM1 (e.g., in the embodiments of FIGS. 3A and 3B).

The dam DM may protrude or extend downwardly from the lower surface S2 of the front redistribution structure 110 to prevent the underfill UF from overflowing, and to increase a contact area between the underfill UF and the second bumps 160b. Accordingly, it is possible to secure excellent results in various reliability tests, for example, a thermal cycling test, a drop test, and the like. The dam DM may have a height H3, of about 10 μm or more in a direction, perpendicular to the lower surface S2 of the front redistribution structure 110, for example, in a range of about 10 μm to about 50 μm, of about 10 μm to about 40 μm, of about 10 μm to about 30 μm, or of about 10 μm to about 20 μm. When the height H3 of the dam DM is less than about 10 μm, an effect of preventing the overflow of the underfill UF may be insignificant. An upper limit of the height H3 of the dam DM is not particularly limited, and may be determined in consideration of the height and degree of integration of the second bumps 160b.

The dam DM may be formed by patterning a different type of insulating material from that of the insulating layer 111. For example, the dam DM may include a non-photosensitive resin, and the insulating layer 111 may include a photosensitive resin, but example embodiments thereof are not limited thereto. Depending on the example embodiment, the dam DM may be formed using photo solder resist (PSR).

The dam DM is not limited to the shape illustrated in the drawings, and may be formed in various shapes depending on processes and materials. For example, as illustrated in FIG. 1B, a side surface DMS of the dam DM toward the second bumps 160b may have an inclination angle of about 90 degrees with respect to the lower surface S2 of the front redistribution structure 110. However, example embodiments thereof are not limited thereto, and the side surface DMS of the dam DM may have an inclination angle of less than about 90 degrees with respect to the lower surface S2 of the front redistribution structure 110. In addition, the side surface DMS of the dam DM may extend from a side wall RSS of the recess RS, but example embodiments thereof are not limited thereto.

As illustrated in FIG. 2A, the dam DM may be spaced apart from a sidewall RSS of the recess RS. For example, an arbitrary remaining space RM may be formed between the side surface DMS of the dam DM and the side wall RSS of the recess RS. In this case, an accommodation space for the underfill UF may be additionally secured, and overflow may be effectively prevented.

As illustrated in FIG. 2B, the dam DM may extend to a corner or a side surface S3 of the front redistribution structure 110. For example, the outer dam DM2 may have a first side surface DMSa facing the second bumps 160b and a second side surface DMSb, coplanar with the side surface S3 of the front redistribution structure 110.

In addition, as illustrated in FIG. 1C, the dam DM may continuously extend along one side of the recess RS, but example embodiments thereof are not limited thereto. Depending on the example embodiment, the dam DM may be discontinuously formed only in a region on which the overflow of the underfill UF is concentrated. As described above, the dam DM may be formed in various shapes, and the shape or material is not particularly limited.

The semiconductor chip 120 may include connection pads 120P disposed on the upper surface S1 of the front redistribution structure 110 and electrically connected to the front redistribution layers 112. The semiconductor chip 120 may be an integrated circuit (IC) in a bare state in which no bumps or interconnection layers are formed, but example embodiments thereof are not limited thereto, and may be a packaged-type integrated circuit. The integrated circuit may be a processor chip such as a central processor (CPU), a graphics processor (GPU), a field programmable gate array (FPGA), an application processor (AP), a digital signal processor, a cryptographic processor, a microprocessor, a microcontroller, and the like, but example embodiments thereof are not limited thereto, and may be a logic chip such as an analog-to-digital converter, application-specific IC (ASIC), and the like, or a memory chip including a volatile memory such as dynamic RAM (DRAM), static RAM (SRAM), and the like, and a non-volatile memory such as phase change RAM (PRAM), magnetic RAM (MRAM), resistive RAM (RRAM), a flash memory, and the like.

The semiconductor chip 120 may include a connection bump 123 connecting the connection pad 120P to a pad portion 112P of the front redistribution layer 112. The connection bump 123 may be disposed between the pad portion 112P and the connection pad 120P. For example, the connection bump 123 may include a pillar portion 121 in contact with the connection pad 120P and a solder portion 122 in contact with the pad portion 112P. An underfill layer 125 may be disposed between the semiconductor chip 120 and the front redistribution structure 110. The underfill layer 125 may include an insulating resin such as an epoxy resin, and may physically and electrically protect the connection bumps 123. The underfill layer 125 may have a capillary underfill (CUF) structure, but example embodiments thereof are not limited thereto. Depending on the example embodiment, the underfill layer 125 may have a molded underfill (MUF) structure integrated with an encapsulant 140.

The through-via 130 may electrically connect the front redistribution layers 112 and the back redistribution layers 152 by penetrating through or extending in the encapsulant 140. The through-via 130 may extend in a vertical direction (Z direction) within the encapsulant 140. An upper surface of the through-via 130 may be exposed from the encapsulant 140, and may be substantially coplanar with an upper surface of the encapsulant 140. For example, the through-via 130 may have a post shape penetrating through or extending in the encapsulant 140. However, the shape of the through-via 130 is not limited thereto. The through-via 130 may include a metal material such as copper (Cu). Depending on the example embodiment, a metal seed layer (not shown) including titanium (Ti), copper (Cu), or the like may be formed on a lower surface of the through-via 130.

The encapsulant 140 may encapsulate or surround at least a portion of the semiconductor chip 120 on the upper surface S1 of the front redistribution structure 110. The encapsulant 140 may include, for example, a thermosetting resin such as an epoxy resin, a thermoplastic resin such as polyimide, or prepreg impregnated with an inorganic filler in these resins, ABF, FR-4, BT, and an epoxy molding compound (EMC). For example, the encapsulant 140 may include EMC.

The back redistribution structure 150 may be disposed on the semiconductor chip 120 and the encapsulant 140, and may include a back insulating layer 151, a back redistribution layer 152, and a back redistribution via 153.

The back insulating layer 151 may include an insulating resin. The insulating resin may include a thermosetting resin such as an epoxy resin, a thermoplastic resin such as polyimide, or a resin impregnated with an inorganic filler in these resins, for example, prepreg, ABF, FR-4, BT, and PID. The back insulating layer 151 may include a plurality of layers stacked in a vertical direction (Z-axis direction). Depending on the process, a boundary between the plurality of layers may be unclear.

The back redistribution layer 152 may be disposed on or in the back insulating layer 151, and may redistribute the through-via 130. The back redistribution layer 152 may include, for example, copper (Cu), aluminum (Al), silver (Ag), tin (Sn), gold (Au), nickel (Ni), lead (Pb), or titanium (Ti), or a metal material including an alloy thereof.

The back redistribution layer 152 may include more or fewer redistribution layers than illustrated in the drawing. The back redistribution layer 152 may include a back pad portion disposed on an upper surface of the back redistribution structure 150. The back pad portion may be physically and electrically connected to an external device (see FIG. 7). A barrier layer (not shown) may be disposed on a surface of the back pad portion.

The back redistribution via 153 may penetrate through or extend in the back insulating layer 151 and be electrically connected to the back redistribution layer 152. For example, the back redistribution vias 153 may interconnect back redistribution layers 152 of different levels. The back redistribution via 153 may be a filled via in which a metal material is filled in a via hole or a conformal via in which a metal material extends along an inner wall of the via hole.

The connection bumps 160 may be disposed on the lower surface S2 of the front redistribution structure 110. The connection bumps 160 may be electrically connected to the semiconductor chip 120 and the through-via 130 through the front redistribution layer 112. The semiconductor package 100A may be connected to an external device such as a module substrate or a system board through connection bumps 160. For example, the connection bumps 160 may include a low-melting point metal, for example, tin (Sn) or an alloy (Sn—Ag—Cu) containing tin (Sn). Depending on the example embodiment, the connection bumps 160 may have a shape in which a pillar (or under bump metal) and a ball are combined. The pillar may include copper (Cu) or an alloy of copper (Cu), and the ball may include a solder ball. Depending on the example embodiment, the insulating layer 111 may include a resist layer protecting the connection bumps 160 from external physical and chemical damage (e.g., in the example embodiments of FIGS. 4A and 4B).

In the present inventive concept, by introducing a large-sized bump (hereinafter, referred to as a second bump 160b) supported by the underfill UF, cracks may be prevented and board level reliability (BLR) may be improved. For example, the connection bumps 160 may include first bumps 160a and second bumps 160b, larger than the first bumps 160a.

The first bumps 160a may be connected to the first redistribution layer 112a of the front redistribution layers 112. The second bumps 160b may be connected to the outer redistribution layer 112b out of the second redistribution layers 112b of the front redistribution layers 112 in the recess RS. The second bumps 160b may have a second width W2, greater than the first width W1 of the first bumps 160a in a direction, parallel to the lower surface S2 of the front redistribution structure 110 (e.g., an X direction). For example, the first width W1 may be in a range of about 150 μm to about 250 μm, and the second width W2 may be in a range of about 200 μm to about 300 μm, but example embodiments thereof are not limited thereto. The recess RS may have a width, equal to or greater than the second width W2 of the second bumps 160b. The second bumps 160b may have a second height, greater than the first height of the first bumps 160a in a direction (Z direction), perpendicular to the lower surface S2 of the front redistribution structure 110. For example, lowermost ends of the second bumps 160b may be at substantially the same height as lowermost ends of the first bumps 160a.

The underfill UF may include an insulating resin such as an epoxy resin, and may be formed to, at least partially, surround the second bumps 160b within the recess RS. The underfill UF may be extended further downwardly than the first level on which the first redistribution layer 112a is located along side surfaces 160S of the second bumps 160b and a side surface DMS of the dam DM. For example, the underfill UF may have a first lower end, adjacent to the second bumps 160b and a second lower end, adjacent to the dam DM and located on a level, higher than the first lower end. In this case, an extension length h from a bottom of the recess RS to the first lower end of the underfill UF may be in a range of about 40% to about 80% of the height of the second bumps 160b. When the extension length h of the underfill UF is less than about 40% of the height of the second bumps 160b, a reliability improvement effect of the second bumps 160b may be insignificant. In addition, when the extension length h of the underfill UF exceeds about 80% of the height of the second bumps 160b, an exposure region of the second bumps 160b for connection with an external device (e.g., a main board) may not be sufficiently secured.

As illustrated in FIG. 1C, on a plane, the underfill UF may fill a space between the second bumps 160b arranged along an extension direction of the recess RS. As used herein, the extension direction of the recess RS may refer to the X-direction and/or the Y-direction, as shown in FIG. 1C. For example, the lower surface S2 of the front redistribution structure 110 may include an inner region IR overlapping the semiconductor chip 120 and an outer region OR surrounding the inner region IR. The recess RS may continuously extend along the outer region OR to expose the outer redistribution layers 112b_out. The inner dam DM1 may be disposed on one side of the recess RS, adjacent to the inner region IR, and the outer dam DM2 may be disposed on the other side of the recess RS, adjacent to the outer region OR. The first bumps 160a may be disposed in the inner region IR, and the second bumps 160b may be disposed in the outer region OR. The second bumps 160b may be spaced apart from each other along the extension direction of the recess RS, and the underfill UF may fill the space between the second bumps 160B, adjacent to each other.

Figure 3A:
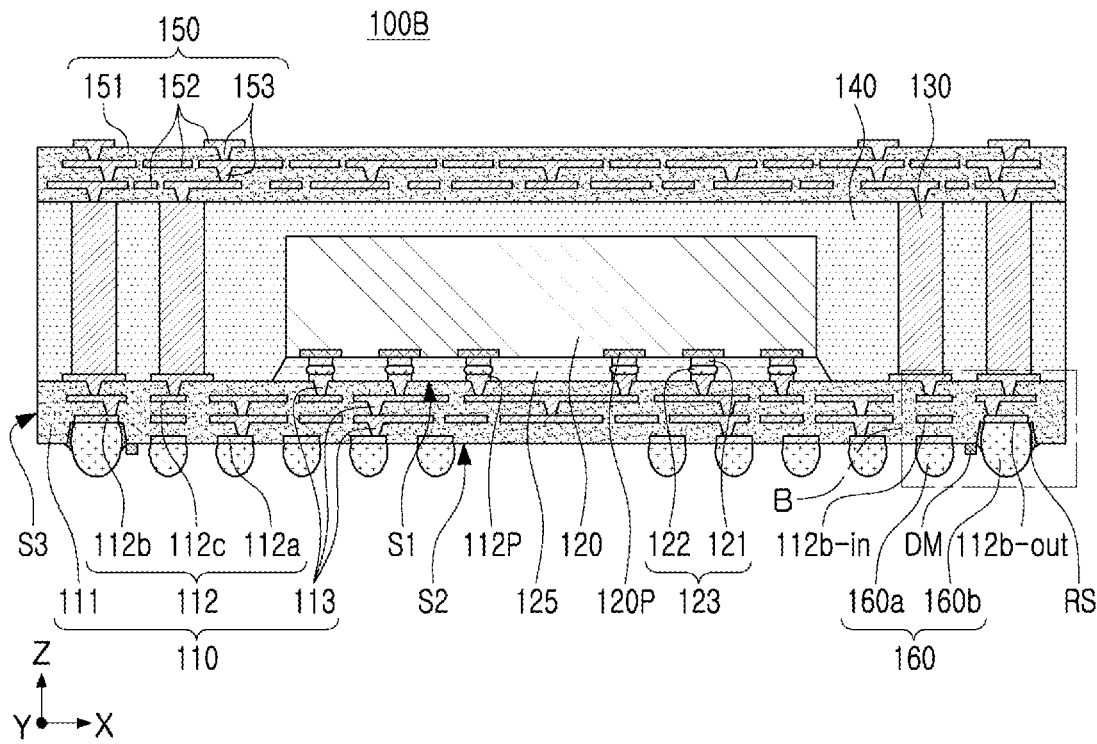
FIG. 3A is a cross-sectional view illustrating a semiconductor package according to example embodiments.
Figure 3B:
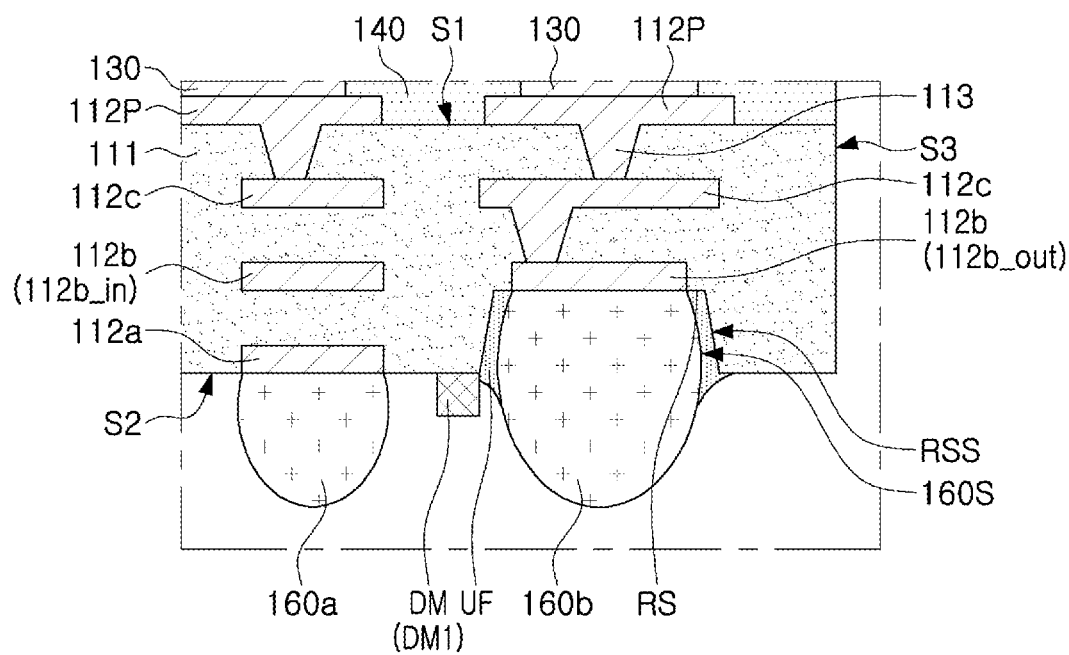
FIG. 3B is a partially enlarged view illustrating the region 'B' of FIG. 3A.

FIG. 3A is a cross-sectional view of a semiconductor package 100B according to example embodiments, and FIG. 3B is a partially enlarged view of the region 'B' of FIG. 3A.

Referring to FIGS. 3A and 3B, the semiconductor package 100B according to example embodiments may have the same or similar characteristics as those described with reference to FIGS. 1A to 2B, except for including only an inner dam DM1 disposed between the first bumps 160a and the second bumps 160b. The inner dam DM1 may be formed by patterning an insulating material. For example, the inner dam DM1 may be formed using a solder resist ink/film. Depending on the example embodiment, the inner dam DM1 may include a material, similar to that of a portion of the insulating layer 111 (e.g., a solder mask) (in the example embodiments of FIGS. 4A and 4B). The inner dam DM1 may prevent the underfill UF from overflowing between the first bumps 160a and the second bumps 160b. In addition, a contact area between the underfill UF and the second bumps 160b may be increased by the inner dam DM1. Accordingly, reliability may be secured in a thermal cycling test, a drop test, and the like.

Figure 4A:
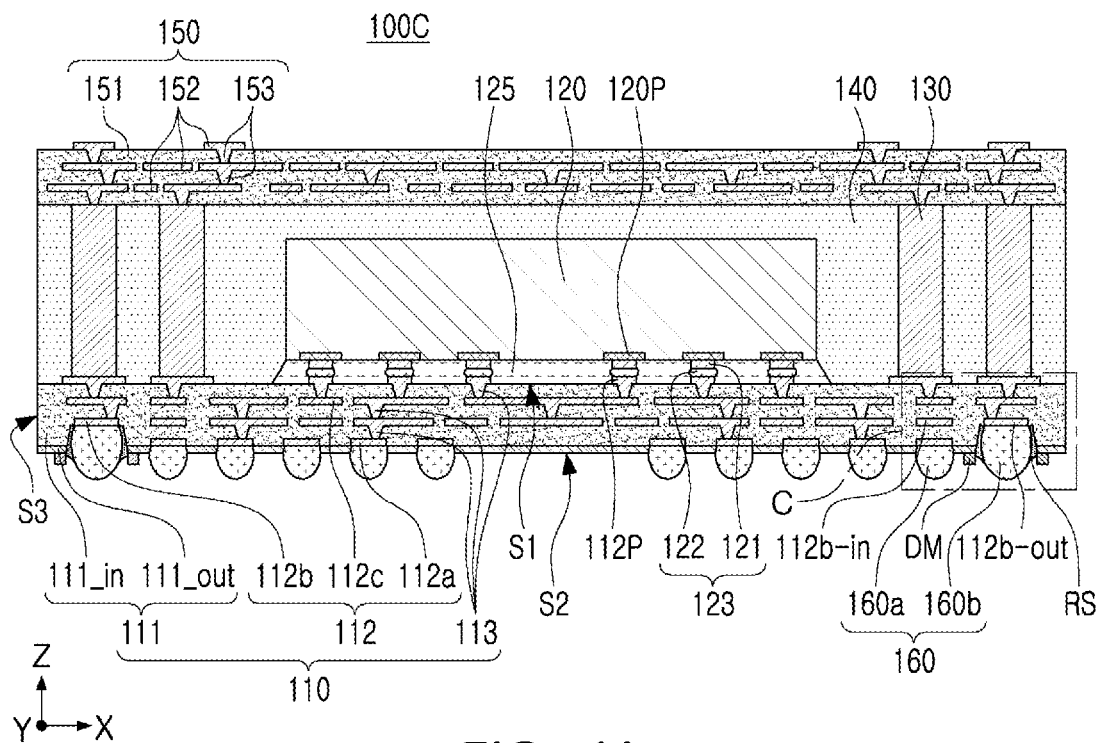
FIG. 4A is a cross-sectional view illustrating a semiconductor package according to example embodiments.
Figure 4B:
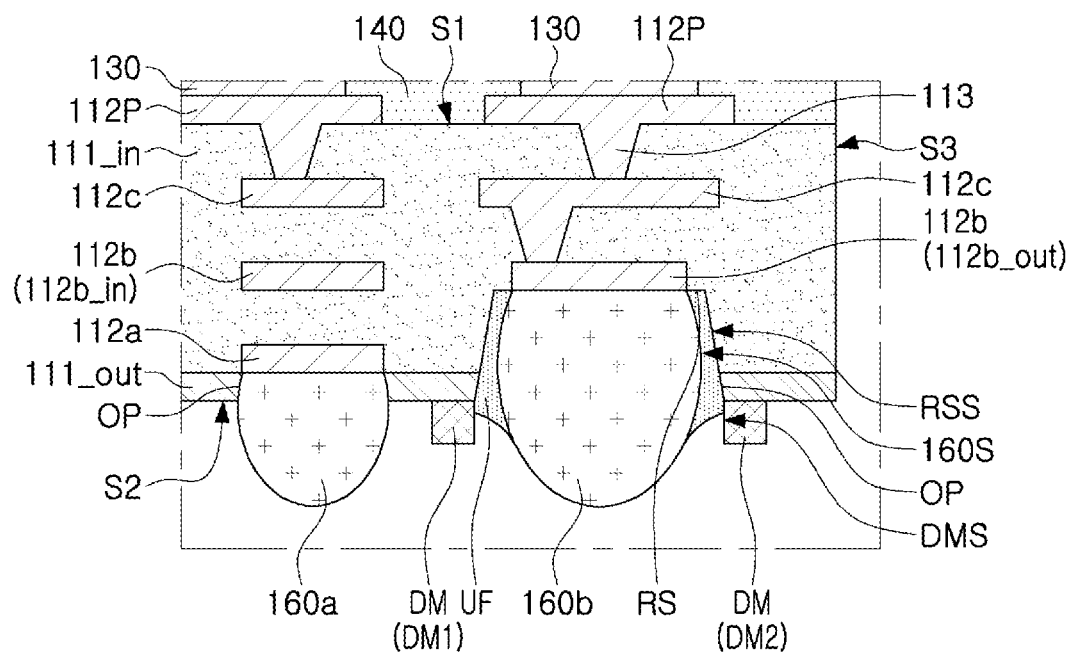
FIG. 4B is a partially enlarged view illustrating the region 'C' of FIG. 4A.

FIG. 4A is a cross-sectional view illustrating a semiconductor package 100C according to example embodiments, and FIG. 4B is a partially enlarged view illustrating the region 'C' of FIG. 4A.

Referring to FIGS. 4A and 4B, the semiconductor package 100C according to example embodiments may have the same or similar characteristics to those described with reference to FIGS. 1A to 3B, except that the insulating layer 111 includes an outer insulating layer 111_out, protecting first redistribution layers 112a and first bumps 160a from external physical and chemical damage.

In example embodiments, the insulating layer 111 may include an inner insulating layer 111_in and an outer insulating layer 111_out. The inner insulating layer 111_in may surround front redistribution layers 112, for example, first redistribution layers 112a and second redistribution layers 112b. The outer insulating layer 111_out may define a lower surface S2 of the front redistribution structure 110 below the inner insulating layer 111_in, and may have openings OP, exposing the first redistribution layers 112a and the outer redistribution layers 112b_out.

In example embodiments, the outer insulating layer 111_out may include a different type of insulating material than the inner insulating layer 111_in. For example, the inner insulating layer 111_in may include a photosensitive resin, and the outer insulating layer 111_out may include a non-photosensitive resin. Depending on example embodiments, the dam DM may include the same material as the outer insulating layer 111_out, for example, prepreg, ABF, or the like.

In example embodiments, the recess RS may pass through or extend in the outer insulating layer 111_out and the inner insulating layer 111_in, to expose the outer redistribution layers 112b_out. The first bumps 160a may be electrically connected to the first redistribution layers 112a through the openings OP of the outer insulating layer 111_out. The second bumps 160b may be electrically connected to the outer redistribution layers 112b_out through the openings OP of the outer insulating layer 111_out.

Figure 5:
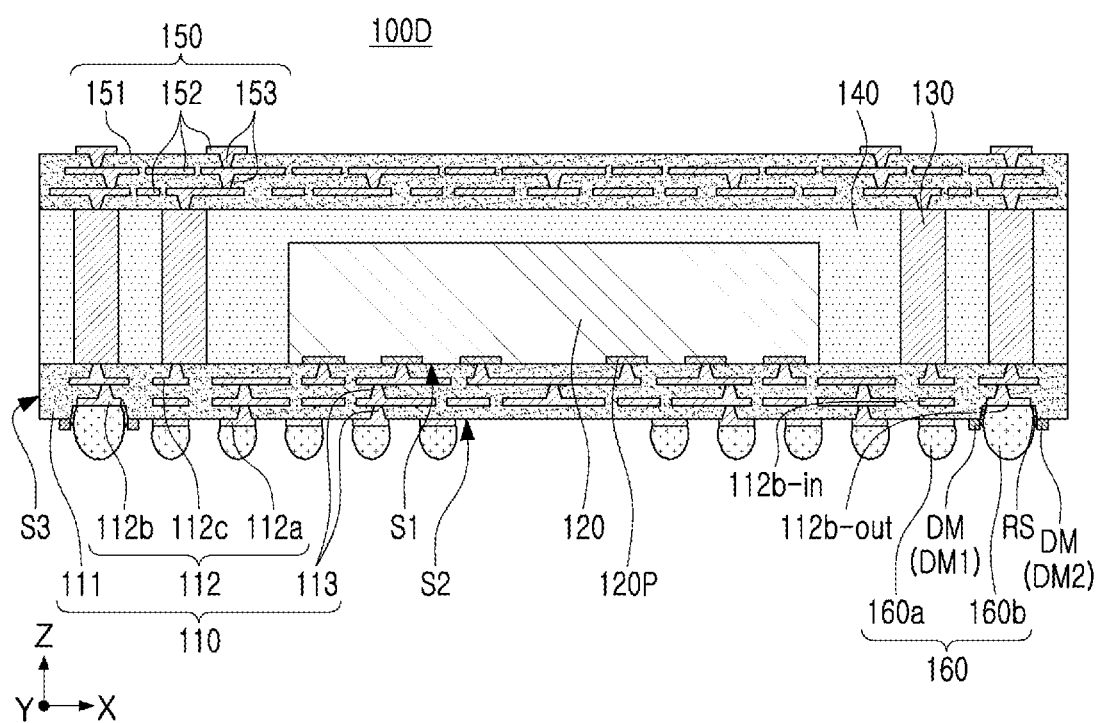
FIG. 5 is a cross-sectional view illustrating a semiconductor package according to example embodiments of the present inventive concept.

FIG. 5 is a cross-sectional view illustrating a semiconductor package 100D according to example embodiments of the present inventive concept.

Referring to FIG. 5, a semiconductor package 100D according to example embodiments may have the same or similar characteristics to those described with reference to FIGS. 1A to 4B, except that the semiconductor chip 120 contacts the front redistribution structure 110. In example embodiments, a lower surface or an active surface of the semiconductor chip 120 on which a connection pad 120P is disposed and an upper surface S1 of the front redistribution structure 110 may come into close contact with each other. For example, the connection pad 120P and the through-via 130 may directly contact the front redistribution via 113. In this case, a barrier layer containing nickel (Ni), gold (Au), or the like may not be formed between the connection pad 120P and the through-via 130 and the front redistribution via 113. The semiconductor package 100D according to example embodiments may be manufactured by forming a molding structure in which the semiconductor chip 120 and the through-via 130 are sealed first, and directly forming a front redistribution structure 110 on one surface of the encapsulant 140 to which the semiconductor chip 120 and the through-via 130 are exposed. According to example embodiments, a semiconductor package 100D having reduced thickness and excellent reliability may be implemented.

Figure 6A:
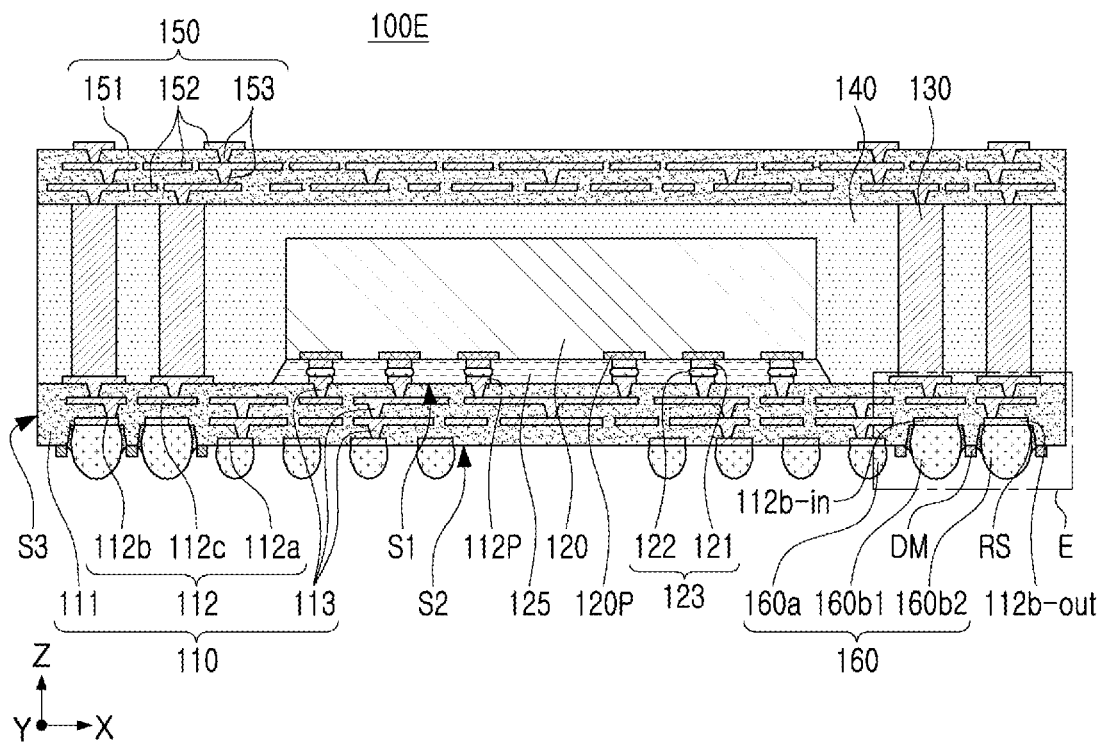
FIG. 6A is a cross-sectional view illustrating a semiconductor package according to example embodiments.
Figure 6B:
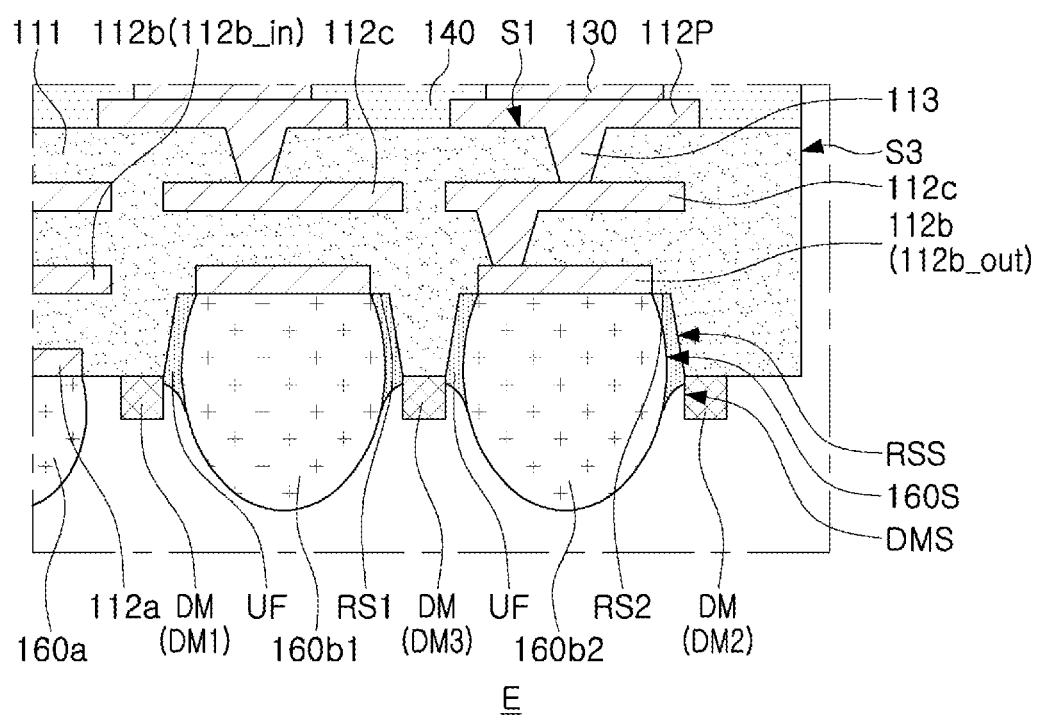
FIG. 6B is a partially enlarged view illustrating the region 'E' of FIG. 6A.

FIG. 6A is a cross-sectional view illustrating a semiconductor package 100E according to example embodiments, and FIG. 613 is a partially enlarged view illustrating the region 'E' of FIG. 6A.

Referring to FIGS. 6A and 69 a semiconductor package 100E according example embodiments may have the same or similar features as those described with reference to FIGS. 1A to 5, except for including a plurality of recesses RS1 and RS2. In example embodiments, second bumps 160b1 of a first group may be disposed in a first recess RS1, and second bumps 160b2 of a second group may be disposed in a second recess RS2. The first recess RS1 and the second recess RS2 may be spaced apart from each other, but example embodiments thereof are not limited thereto. Depending on example embodiments, the first recess RS1 and the second recess RS2 may be integrated into one. A dam DM may be disposed between the first recess RS1 and the second recess RS2. For example, the dam DM may include a first inner dam DM1 disposed between the first bumps 160a and the second bumps 160b1 of the first group, a second inner dam DM3 disposed between the second bumps 160b1 of the first group and the second bumps 160b2 of the second group, and an outer dam DM2 disposed further outside than the second bumps 160b2 of the second group (e.g., disposed between the second bumps 160b2 of the second group and a side surface S3 of the front redistribution structure 110). The second inner dam DM3 may prevent the underfill UF from overflowing between the second bumps 160b1 of the first group and the second bumps 160b2 of the second group. However, depending on example embodiments, the second inner dam DM3 may be omitted.

Figure 7:
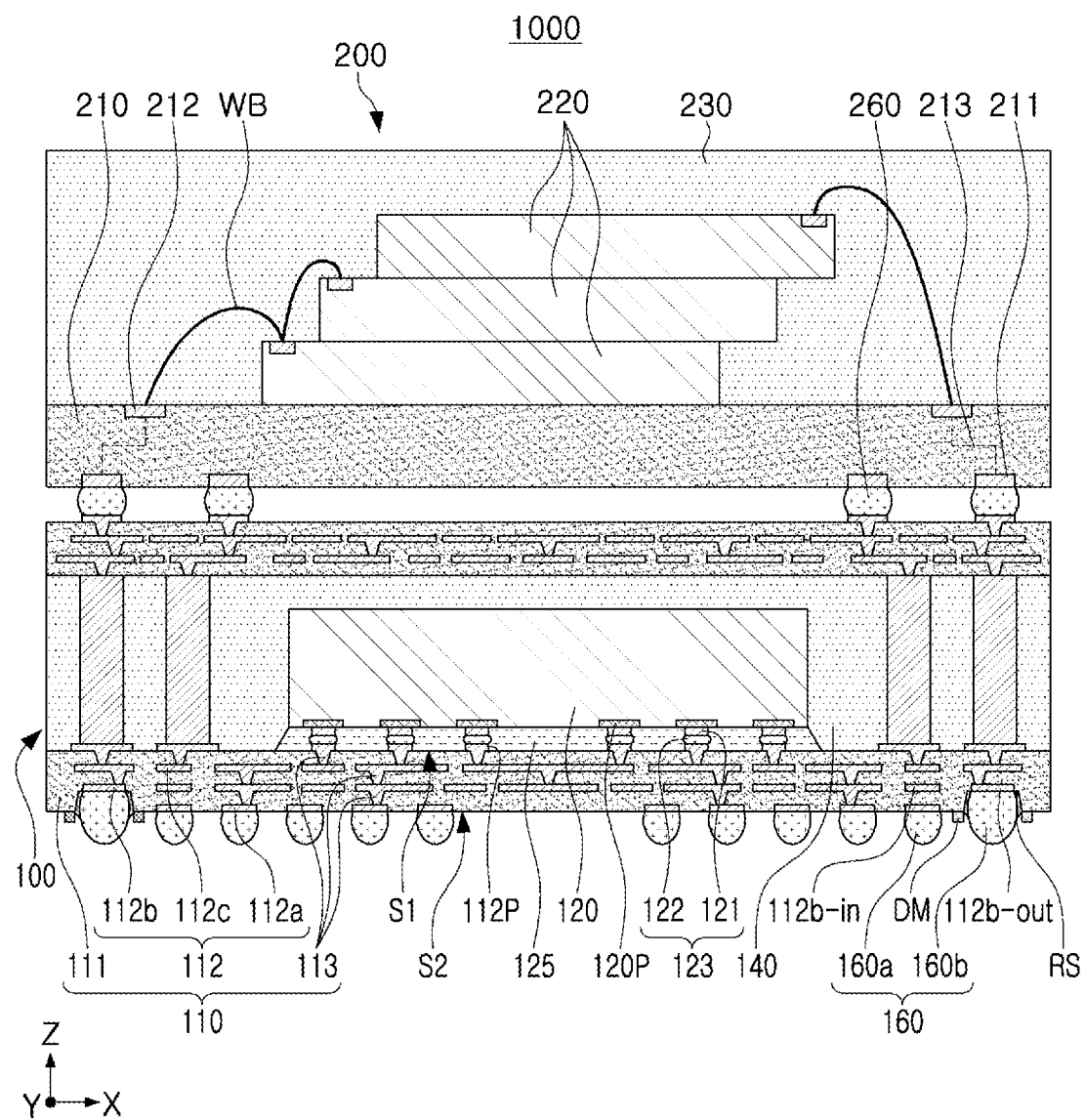
FIG. 7 is a cross-sectional view illustrating a semiconductor package according to example embodiments.

FIG. 7 is a cross-sectional view illustrating a semiconductor package 1000 according to example embodiments of the present inventive concept.

Referring to FIG. 7, a semiconductor package 1000 according to example embodiments may include a first package 100 and a second package 200. The first package 100 is illustrated the same as the semiconductor package 100A illustrated in FIG. 1A, but may be replaced with the semiconductor packages 100B, 100C, 100D, or 100E, described with reference to FIGS. 2A to 6B, and semiconductor packages having characteristics, similar thereto.

The second package 200 may include a redistribution substrate 210, a second semiconductor chip 220, and a second encapsulant 230. The redistribution substrate 210 may include a lower pad 211 and an upper pad 212 that can be electrically connected to an external side thereof on a lower surface and an upper surface thereof, respectively. In addition, the redistribution substrate 210 may include a redistribution circuit 213 electrically connecting the lower pad 211 and the upper pad 212 to each other.

The second semiconductor chip 220 may be mounted on the redistribution substrate 210 by a wire bonding or flip chip bonding method. For example, the plurality of second semiconductor chips 220 may be vertically stacked on the redistribution substrate 210, and may be electrically connected to the upper pad 212 of the redistribution substrate 210 by bonding wires WB. In one example, the second semiconductor chip 220 may include a memory chip, and the first semiconductor chip 120 may include an AP chip.

The second encapsulant 230 may include the same or similar material as the encapsulant 140 of the first package 100. The second package 200 may be physically and electrically connected to the first package 100 by a conductive bump 260. The conductive bump 260 may be electrically connected to a redistribution circuit 213 inside the redistribution substrate 210 through the lower pad 211 of the redistribution substrate 210. The metal bump 260 may include a low-melting point metal, for example, tin (Sn) or an alloy containing tin (Sn).

The semiconductor package 1000 according to example embodiments may include a first package 100 in which a recess RS accommodating a second bump 160b and an underfill OF supporting and fixing the second bump 160b are introduced. In addition, a package-on-package structure having improved board level reliability may be implemented in the semiconductor package 1000.

FIGS. 8A to 8H are cross-sectional views illustrating a r manufacturing process of the semiconductor package 100A of FIG. 1A according to a process sequence.

Figure 8A:
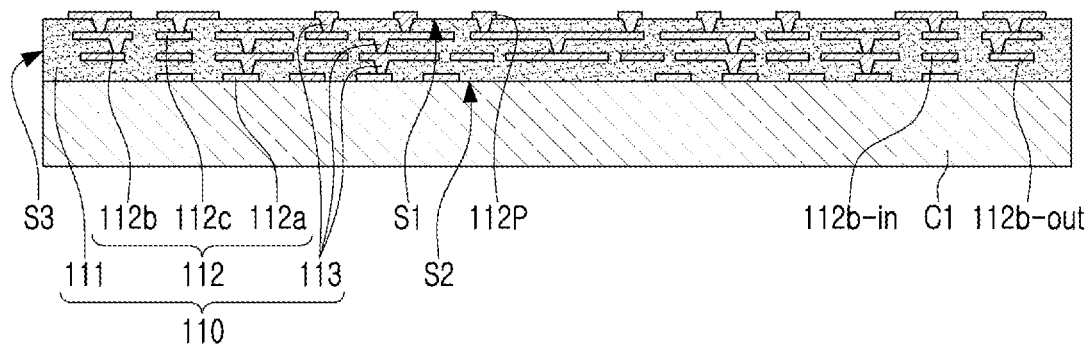

Referring to FIG. 8A, a front redistribution structure 110 may be formed on a first carrier C1. For example, the first carrier may be sequentially coated with a polymer layer including a curable resin and a metal layer including nickel (Ni) and titanium (Ti) on a copper clad laminate (CCL).

The front redistribution structure 110 may include an insulating layer 111, a front redistribution layer 112, and a front redistribution via 113. The insulating layer 111 may be formed by sequentially applying and curing a photosensitive material, for example, PID. The front redistribution layer 112 and the front redistribution via 113 may perform an exposure process and a development process to form a via hole penetrating through or extending in the insulating layer 111, and may be formed by patterning a metal material on the insulating layer 111 using a plating process. A pad portion 112P may be formed on an upper surface S1 of the front redistribution structure 110. A barrier layer (not shown) including nickel (Ni), gold (Au), or the like may be formed on the pad portion 112P.

Figure 8B:
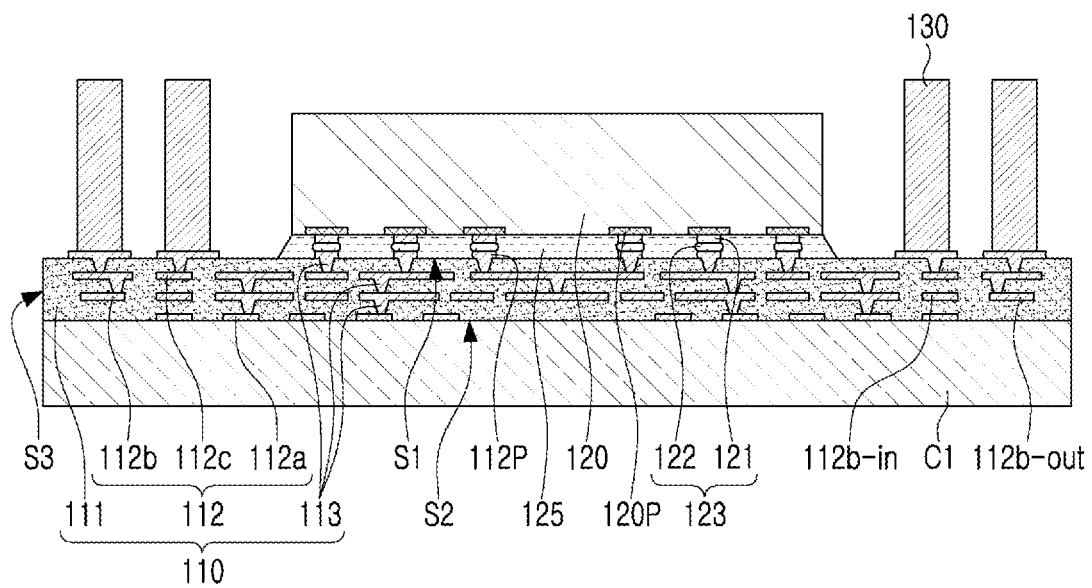

Referring to FIG. 8B, a through-via 130 may be formed on the pad portion 112P. The through-via 130 may be formed by performing a plating process. The through-via 130 may include a metal material such as copper (Cu). Depending on the example embodiment, a metal seed layer (not shown) including titanium (Ti), copper (Cu), or the like may be formed on a lower surface of the through-via 130.

Next, a semiconductor chip 120 may be mounted on the front redistribution structure 110. The semiconductor chip 120 may be mounted in a flip-chip method. For example, the semiconductor chip 120 may be connected to the pad portion 112P through connection bumps 123 formed on the connection pad 120P. An underfill layer 125 may be formed between the semiconductor chip 120 and the front redistribution structure 110. The underfill layer 125 may be formed using a CUF process, but example embodiments thereof are not limited thereto.

Figure 8C:
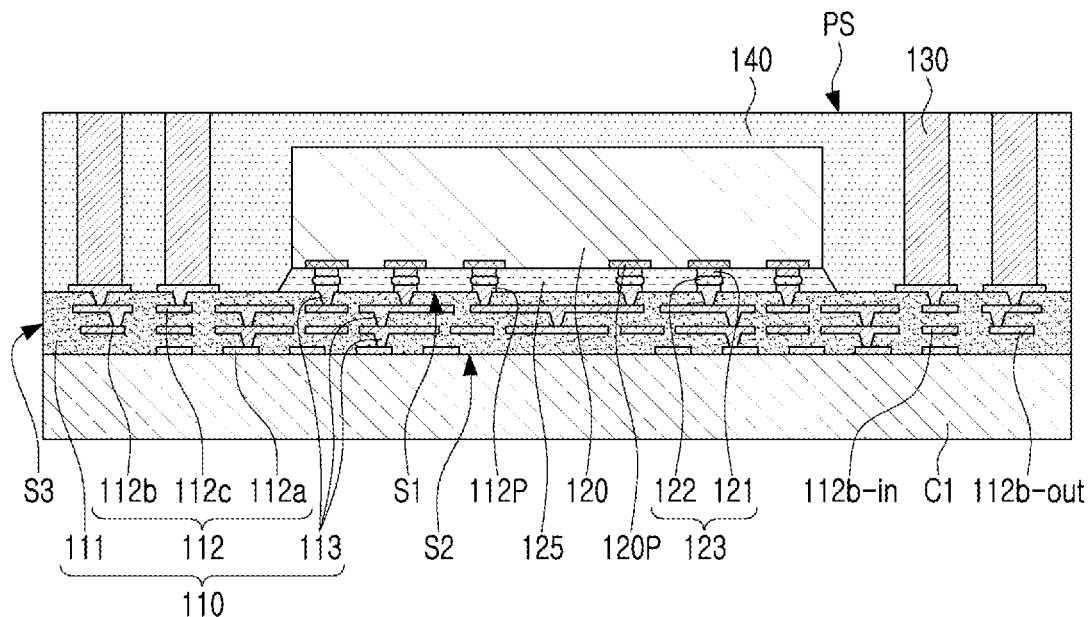

Referring to FIG. 8C, an encapsulant 140 may be formed to encapsulate or surround at least a portion of each of the semiconductor chip 120 and the through-via 130. For example, the encapsulant 140 may be formed by applying and curing EMC. A planarization process may be applied to an upper portion of the encapsulant 140. The planarization process may include a grinding process, a chemical mechanical polish (CMP) process, and the like. An upper end of the through-via 130 may be exposed to an upper surface of the encapsulant 140 by the planarization process. Accordingly, a planar surface PS composed of the upper surface of the through-via 130 and the upper surface of the encapsulant 140 may be formed.

Figure 8D:
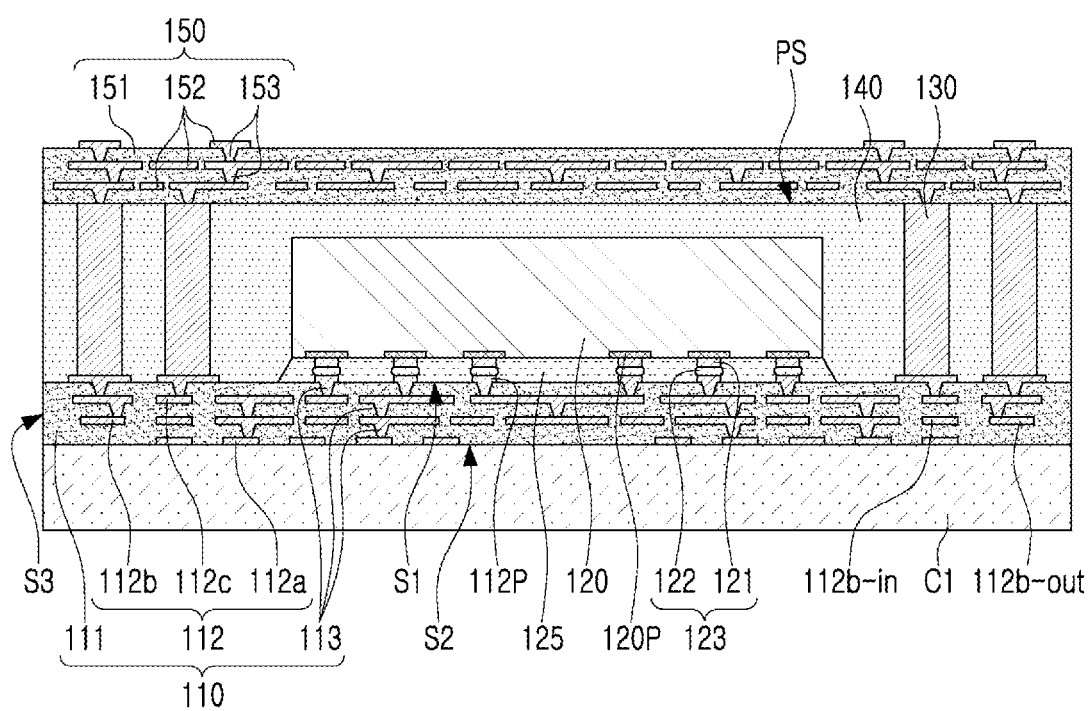

Referring to FIG. 8D, a back redistribution structure 150 may be formed on the encapsulant 140. The back redistribution structure 150 may be formed by a process, similar to that of the front redistribution structure 110. The insulating layer 151 may be formed by sequentially coating and curing a photosensitive material, for example, PID. An exposure process and a development process may be performed on the back redistribution layer 152 and the back redistribution via 153, to form a via hole penetrating or extending in the insulating layer 151, and the back redistribution layer 152 and the back redistribution via 153 may be formed by patterning a metal material on the insulating layer 151 using a plating process. A barrier layer (not shown) may be formed on a pad portion, exposed to an upper surface of the back redistribution structure 150.

Figure 8E:
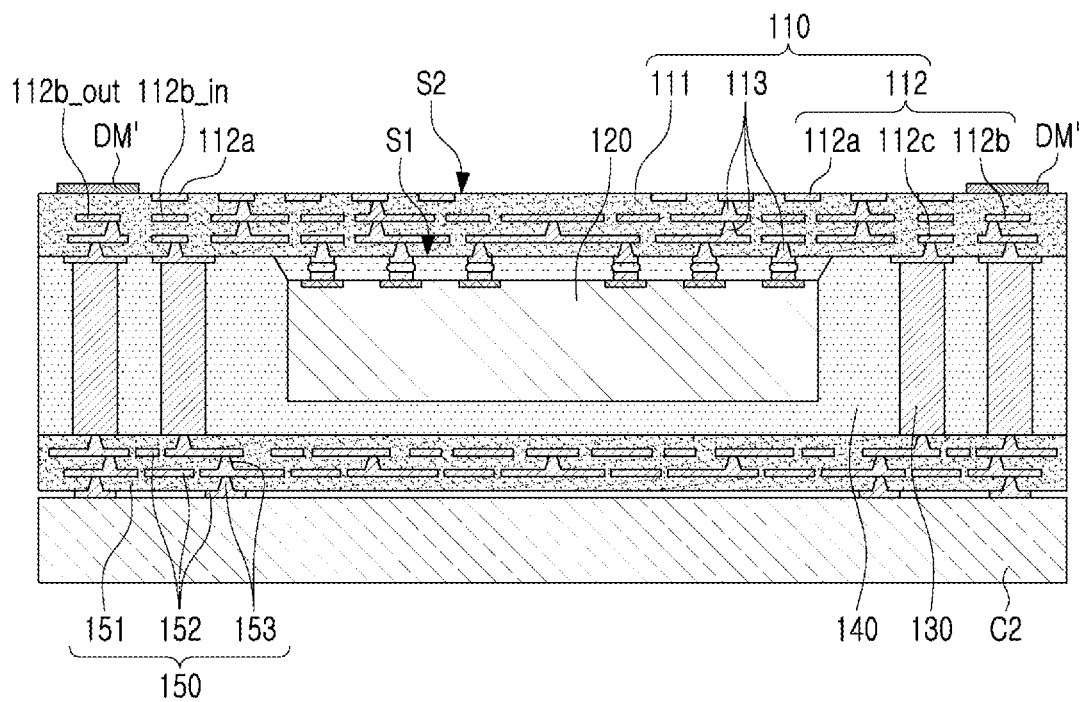

Referring to FIG. 8E, a reserve dam DM' may be formed on a lower surface S2 of the front redistribution structure 110. The package structure on which the back redistribution structure 150 is formed may be attached to a second carrier C2 so that the lower surface S2 of the front redistribution structure 110 is exposed. The reserve dam DM' may be disposed only in a partial region, overlapping an outer redistribution layer 112b_out. The reserve dam DM' may be formed by patterning an insulating material applied to the lower surface S2 of the front redistribution stricture 110. For example, the reserve dam DM' may be formed by attaching prepreg to the entire lower surface S2 of the front redistribution structure 110 and patterning the prepreg. Depending on the example embodiment, the reserve dam DM' may also be formed by attaching an insulating film patterned in a predetermined shape to the lower surface S2 of the front redistribution structure 110.

Figure 8F:
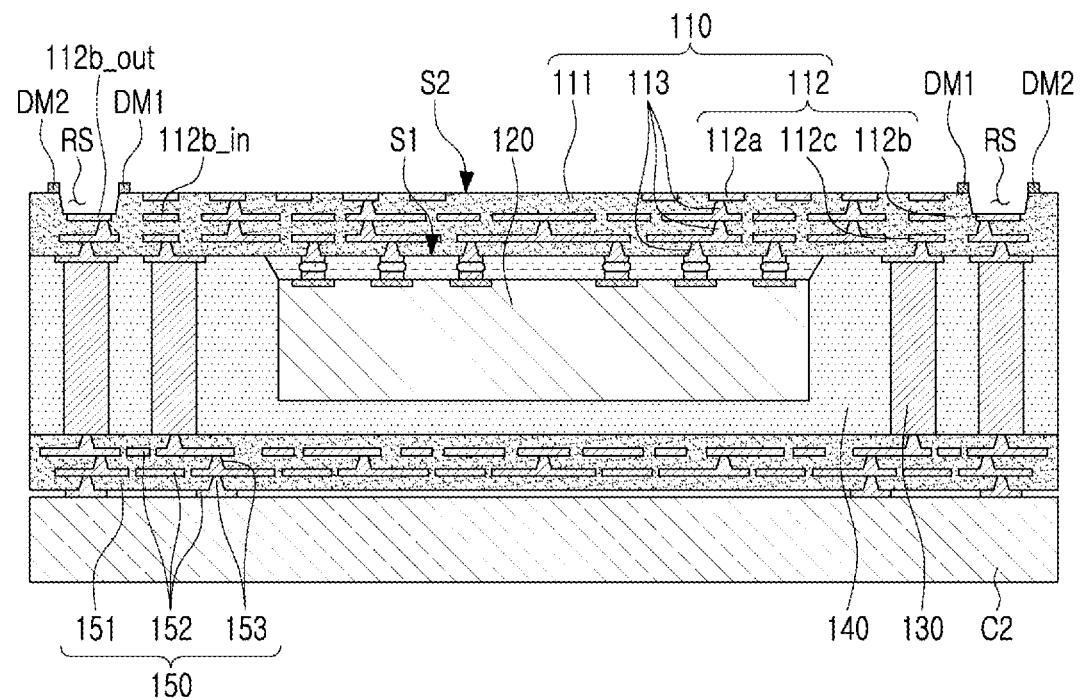

Referring to FIG. 8F, a recess RS extending into the insulating layer 111 through the reserve dam DM' may be formed. The recess RS may be formed by etching a portion of the reserve dam DM' and the insulating layer 111. The recess RS may be formed to expose the outer redistribution layer 112b_out. The outer redistribution layer 112b_out may act as an etch stop layer in a process of forming the recess RS. In this case, the outer redistribution layer 112b_out may protrude further than a bottom of the recess RS. Depending on the process, a width of the bottom of the recess RS may be equal to or smaller than the width of the outer redistribution layer 112b_out. The reserve dam DM' may be separated into an inner dam DM1 and an outer dam DM2 by the recess RS.

Figure 8G:
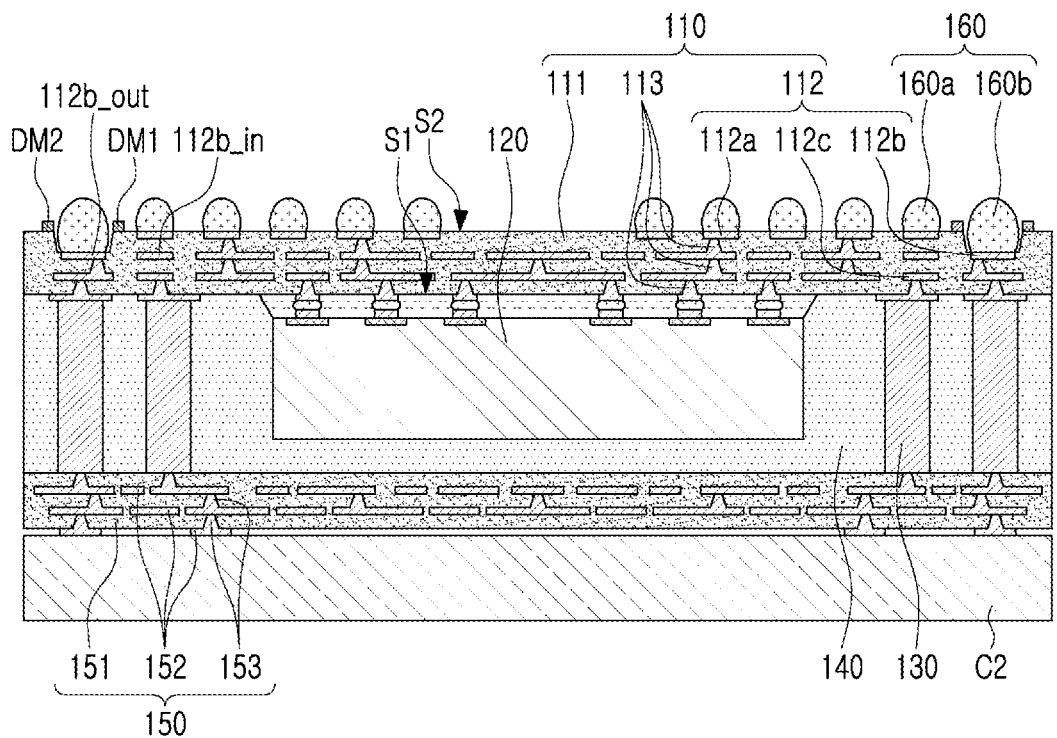

Referring to FIG. 8G, connection bumps 160 may be formed on the front redistribution structure 110. The connection bumps 160 may include first bumps 160a and second bumps 160b. For example, the first bumps 160a may be formed first, and then the second bumps 160b may be formed, but example embodiments thereof are not limited thereto. The second bumps 160b may be connected to outer redistribution layers 112b_out in the recess RS. The second bumps 160b may have a larger volume (width and height) than that of the first bumps 160a, and may have relatively excellent reliability. According to the present inventive concept, by disposing the second bumps 160b in a region where stress is concentrated, cracks may be prevented and reliability of the package may be improved.

Figure 8H:
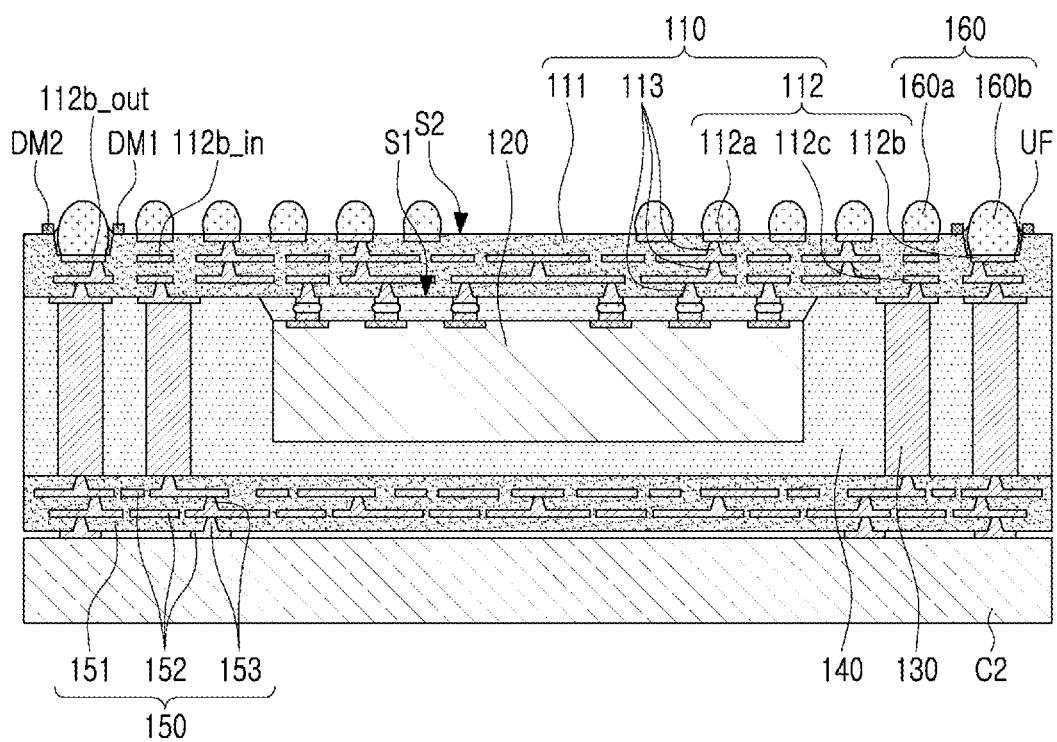

Referring to FIG. 8H, an underfill UF may be formed in a recess RS. The underfill UF may be formed by filling the recess RS with an insulating material. For example, the underfill UF may be injected between second bumps 160b, spaced apart in a Y direction. The underfill UF may contact side surfaces of the second bumps 160b, a sidewall of the recess RS, and a side surface of a dam DM. The underfill IX may support the second bumps 160b to prevent cracks, and secure reliability in a thermal cycling test, a drop test, and the like, Thereafter, a sawing process (not shown) may be performed to complete the semiconductor package illustrated in FIG. 1A.

As set forth above, according to example embodiments of the present inventive concept, a semiconductor package having improved reliability may be provided by forming a recess in which a large bump is accommodated and introducing an underfill covering or on the large bump in the recess.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

While example embodiments have been shown and described above, it will be apparent to those skilled in the art that modifications and variations could be made without departing from the scope of the present inventive concept as defined by the appended claims.

What is claimed is:

1. A semiconductor package, comprising:
 a front redistribution structure that has an upper surface, a lower surface opposing the upper surface, and a side surface, the front redistribution structure comprising:
  an insulating layer that defines the upper surface, the lower surface, and the side surface;
  front redistribution layers that include a first redistribution layer on a first level adjacent to the lower surface and second redistribution layers on a second level higher than the first level relative to the lower surface, the second redistribution layers having an inner redistribution layer and an outer redistribution layer between the inner redistribution layer and the side surface;
  a recess that extends into the insulating layer from the lower surface to expose at least a portion of the outer redistribution layer; and
  a dam on at least one side of the recess;
 a semiconductor chip on the upper surface of the front redistribution structure and including a connection pad electrically connected to the front redistribution layers;
 an encapsulant that seals at least a portion of the semiconductor chip on the upper surface of the front redistribution structure;
 a back redistribution structure on the encapsulant and including back redistribution layers;
 a through-via that extends in the encapsulant and electrically connects the front redistribution layers to the back redistribution layers;
 connection bumps on the lower surface of the front redistribution structure and including a first bump electrically connected to the first redistribution layer and a second bump electrically connected to the outer redistribution layer within the recess; and
 an underfill that extends along a side surface of the second bump and a side surface of the dam within the recess.

2. The semiconductor package of claim 1, wherein the underfill extends further downwardly than the first level relative to the upper surface of the front redistribution structure.

3. The semiconductor package of claim 1, wherein the underfill has a first lower end adjacent to the second bump and a second lower end adjacent to the dam, and
 wherein the first lower end is located on a level lower than the second lower end relative to the lower surface of the front redistribution structure.

4. The semiconductor package of claim 3, wherein a length from a bottom of the recess to the first lower end of the underfill is in a range of about 40% to about 80% of a height of the second bump in a direction perpendicular to the lower surface of the front redistribution structure.

5. The semiconductor package of claim 1, wherein the second bump has a second width greater than a first width of the first bump in a direction parallel to the lower surface of the front redistribution structure.

6. The semiconductor package of claim 5, wherein the recess has a width equal to or greater than the second width in the direction.

7. The semiconductor package of claim 5, wherein the first width is in a range of about 150 µm to about 250 and the second width is in a range of about 200 µm to about 300 µm.

8. The semiconductor package of claim 1, wherein the second bump has a second height greater than a first height of the first bump in a direction perpendicular to the lower surface of the front redistribution structure.

9. The semiconductor package of claim 8, wherein a lowermost end of the second bump is on a same level as a lowermost end of the first bump in the direction.

10. The semiconductor package of claim 1, wherein the dam comprises an inner dam between the second bump and the first bump, and an outer dam between the second bump and the side surface of the front redistribution structure.

11. The semiconductor package of claim 1, wherein the dam extends downwardly from the lower surface of the front redistribution structure.

12. The semiconductor package of claim 11, wherein the dam has a height of about 10 μm or more in a direction perpendicular to the lower surface of the front redistribution structure.

13. The semiconductor package of claim 1, wherein the recess has a depth in a direction perpendicular to the lower surface of the front redistribution structure in a range of about 10% to about 25% of a thickness in the direction from the upper surface to the lower surface of the front redistribution structure.

14. A semiconductor package, comprising:
a semiconductor chip;
a front redistribution structure having an upper surface that the semiconductor chip is on and a lower surface that includes an inner region overlapping the semiconductor chip in a direction perpendicular to the lower surface and an outer region that at least partially surrounds the inner region, the front redistribution structure comprising:
an insulating layer that defines the upper surface and the lower surface;
first redistribution layers adjacent to the lower surface;
second redistribution layers more adjacent to the upper surface than the first redistribution layers;
a recess that extends along the outer region and exposes at least a portion of one or more of the second redistribution layers; and
an inner dam on a first side of the recess adjacent to the inner region;
first bumps in the inner region and electrically connected to the first redistribution layers;
second bumps in the outer region and electrically connected to the at least a portion of the one or more of the second redistribution layers; and
an underfill that at least partially surrounds the second bumps in the recess.

15. The semiconductor package of claim 14, wherein the second bumps are spaced apart from each other in an extension direction of the recess, and
wherein the underfill is in a space between ones of the second bumps that are adjacent to each other.

16. The semiconductor package of claim 14, wherein the front redistribution structure further comprises an outer dam on a second side of the recess that opposes and is spaced apart from the first side of the recess.

17. A semiconductor package, comprising:
a front redistribution structure that has an upper surface and a lower surface opposing each other, the front redistribution structure comprising:
first redistribution layers adjacent to the lower surface;
second redistribution layers more adjacent to the upper surface than the first redistribution layers;
an inner insulating layer that at least partially surrounds the first redistribution layers and the second redistribution layers;
an outer insulating layer defining the lower surface below the inner insulating layer and having openings that expose at least a portion of one or more of the first redistribution layers;
a recess exposing at least a portion of one or more of the second redistribution layers and extending in the outer insulating layer and the inner insulating layer; and
a dam on at least one side of the recess:
a semiconductor chip on the upper surface of the front redistribution structure;
first bumps in the openings of the outer insulating layer and electrically connected to the at least a portion of the one or more of the first redistribution layers;
second bumps in the recess and electrically connected to the at least a portion of the one or more of the second redistribution layers; and
an underfill that at least partially surrounds the second bumps within the recess.

18. The semiconductor package of claim 17, wherein the dam comprises a same material as the outer insulating layer.

19. The semiconductor package of claim 17, wherein the inner insulating layer comprises a photosensitive resin, and
wherein the outer insulating layer comprises a non-photosensitive resin.

20. The semiconductor package of claim 17, wherein the one or more of the second redistribution layers are on an edge of the front redistribution structure.

* * * * *